July 7, 1959 D. TANN 2,893,150

WIRING BOARD AND METHOD OF CONSTRUCTION

Filed Dec. 22, 1955 2 Sheets-Sheet 1

INVENTOR.
David Tann
BY
Harness, Dickey & Pierce
ATTORNEYS.

July 7, 1959 D. TANN 2,893,150

WIRING BOARD AND METHOD OF CONSTRUCTION

Filed Dec. 22, 1955 2 Sheets-Sheet 2

INVENTOR.
David Tann
BY
Harness, Dickey & Pierce
ATTORNEYS

United States Patent Office 2,893,150
Patented July 7, 1959

2,893,150

WIRING BOARD AND METHOD OF CONSTRUCTION

David Tann, Detroit, Mich.

Application December 22, 1955, Serial No. 554,817
6 Claims. (Cl. 41—24)

This invention relates to circuits in the nature of a wiring pattern, and particularly to a wiring pattern placed upon a wiring board, and to the method of producing the wiring pattern on the board.

Various methods have been employed heretofore to provide printed circuits upon wiring boards to accurately locate the circuits thereon and provide apertures for leads to be connected thereto.

The present invention pertains to a wiring board having conducting circuits thereon which are provided by applying an adhesive to the board following the outline of the circuits on which conducting particles are placed and retained in conducting relationship after the adhesive becomes hardened. Various methods may be employed to apply the adhesive to the board, some of which are herein illustrated and others of which will be apparent to those skilled in the art. One method embodies the embossment of areas conforming in dimension to the conducting surfaces on the board and rolling or otherwise applying the adhesive to the surface of the embossed areas to which the conducting particles are adhered. During the embossing operation, the apertures for the leads of elements to be placed in the circuit may be punched in the board so that in a single press operation the board is embossed and punched. A printing plate may be etched to have raised areas which are negatives of the conducting areas to which the adhesive may be applied and which is then lowered onto the wiring board to transfer the adhesive thereto.

Another satisfactory method which may be mentioned is that of employing a screen through which the adhesive is squeegeed onto the board, accurately covering the conducting areas of the boards. After the adhesive is applied to the board, the conducting particles, preferably of copper dust, are applied over the entire surface of the board and the adhesive is air or oven dried and the copper particles removed from the untreated area of the board, either forcibly by shaking the particles from the board, by vacuum means or the like.

The board on which the circuits are applied by the method of this invention may be any of a wide variety of materials including wood, composition materials such as Masonite and other synthetic boardlike materials, or plastics. Plastic materials that are capable of being formed into flat sheets or boards are suitable whether thermosetting or thermoplastic so long as a suitable adhesive is chosen to form the coating layer. It is preferred to employ low cost plastic materials such as the phenol-aldehydes, urea-aldehydes, etc. which may contain conventional fillers as desired. The resulting board has high dielectric properties to prevent leakage between the circuits.

Any adhesive known in the art to be suitable may be employed, but when a board is utilized having a resin binder the adhesive may be the resin which will readily bond to the board. The embossment may be done by heated dies when a board is made of thermoplastic resin or of thermosetting resin when in postsettable stage. The printing plate may be heated when such resin boards are employed so that the area for forming the conducting patterns will become tacky and hold the copper dust or particles when immediately applied thereto.

Accordingly, the main objects of the invention are: to provide a board with conducting circuits made from conducting particles bonded to the board by an adhesive; to provide a board with conducting surfaces by embossing the areas for the circuits on the board and punching the lead holes therethrough and retaining conducting particles in intimate relationship by an adhesive applied to the embossed areas; to apply an adhesive over the conducting area of the board by a printing plate or screen in the conventional manner and have the adhesive support the conducting particles applied thereto before the adhesive hardens; to form a wiring board by the application of an adhesive to the area to be occupied by the conducting material and applying copper particles to the adhesive area in conducting relation to each other; and, in general, to form a wiring board which is simple in construction and economical of manufacture.

Other objects and features of novelty of the invention will be specifically pointed out or will become apparent when referring, for a better understanding of the invention, to the following description taken in conjunction with the accompanying drawings, wherein.

Figure 1:
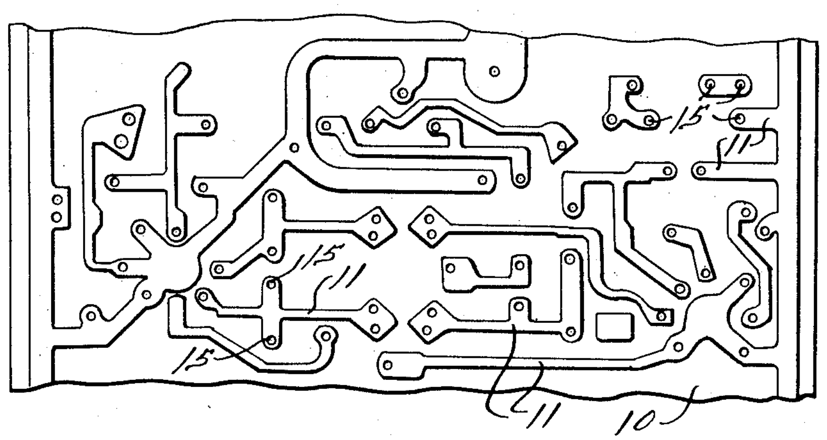
Figure 1 is a broken plan view of a wiring board embodying features of the present invention.
Figure 2:
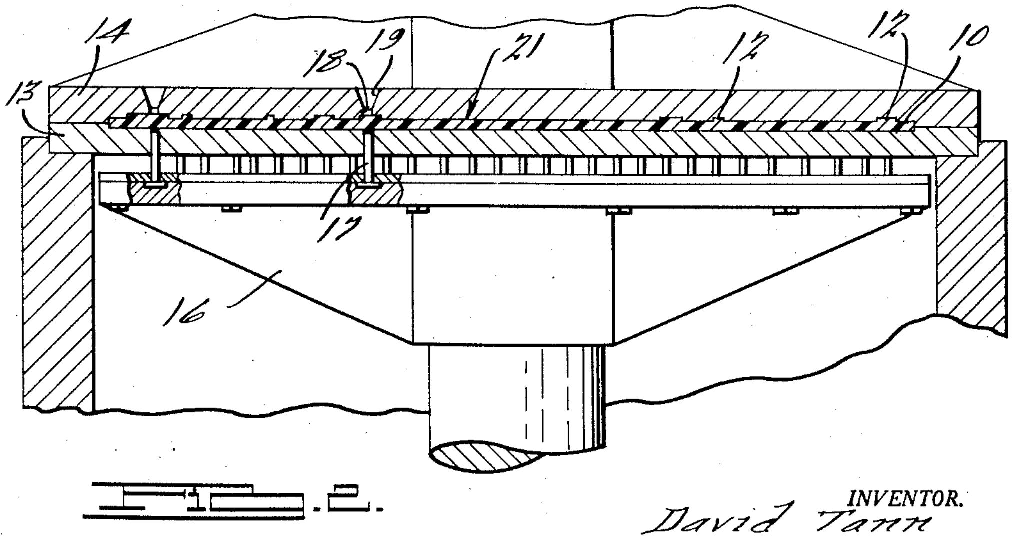
Fig. 2 is a broken sectional view of a press in which a wiring board is embossed and punched.

In Fig. 1 a wiring board 10 is illustrated having wiring patterns 11 disposed thereon constructed in accordance with the method of the present invention. As illustrated in Fig. 2, the board 10 has the areas of the wiring pattern embossed at 12 so that these areas are slightly higher than the face of the board. The board may be made of any material known to be suitable, having desired characteristics to remain stable, resisting any tendency to warp or bend and to provide sufficient strength to support the various elements to be mounted in conducting relationship to the wire patterns and the tubes and other elements supported thereby. The board preferably is a resin laminate which is thermoplastic or thermosetting, and it is to be understood that in some instances heat is provided in the die elements 13 and 14 so as to soften the board to permit the ready embossment thereof and to heat-cure the board if the resin is a thermosetting one. The board may be of standard and known types which have sufficient compactibility to be embossed to have the wiring pattern area slightly raised above the face of the board.

The apertures 15 which are provided through the board into the wiring pattern areas may be drilled or punched therein and, as illustrated in Fig. 2, may be punched therein after the embossing operation by the upward movement of a ram 16 having a plurality of punches 17 therein which are aligned with shearing apertures 18 in the upper die element 14. The pins preferably extend through the area 18 so that the sheared portions of the board will be loosely retained within the conical portions 19 of the apertures and can be moved therefrom by successive stamping operations.

The plate 21 thus embossed and punched is placed upon a conveyor 22 and moved past a roller 23 which transfers an adhesive 24 from a tank 25 and rollers 26 and 27 to the embossed areas 12 of the wiring board 21. Thereafter, the board is advanced beneath a nozzle 28 which sprays fine copper particles 30 upon the adhesive 24 and over the entire surface of the plate which will be securely retained on the embossed areas after the adhesive dries. The conveyor is illustrated as carrying the board 21 through a drying oven 29 if rapid drying is desired, although air drying of certain adhesives occurs in short enough time to eliminate the oven 29. After passing through the oven, the loose copper particles on the face of the board other than on the wiring pattern areas are forcibly shaken therefrom or withdrawn by a vacuum nozzle 31. The particles are collected and placed in a hopper to be again delivered to the nozzle 28.

Figure 4:
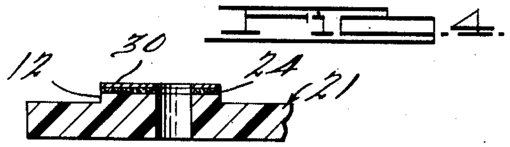
Fig. 4 is an enlarged sectional view of the board after the conducting circuit is applied thereto.

The wiring board thus formed is illustrated in section in Fig. 4 as having the embossed area 12, the layer of adhesive 24 and the layer of copper particles 30 in conductive relation to each other and firmly anchored to the wiring board by the adhesive 24. The adhesive may be of any type known in the art to be suitable and a resin laminate may be employed as the board 10. The same resin is supplied in the tank 25 to assure a satisfactory bond with the same resin of the board. The heat in the oven 29 may be such as to slightly soften the resin so that the two will completely cohere with each other. It is to be understood in such an arrangement that the copper particles are removed from the face of the board; otherwise the tacky condition of the face may retain the copper particles thereon.

Figure 3:
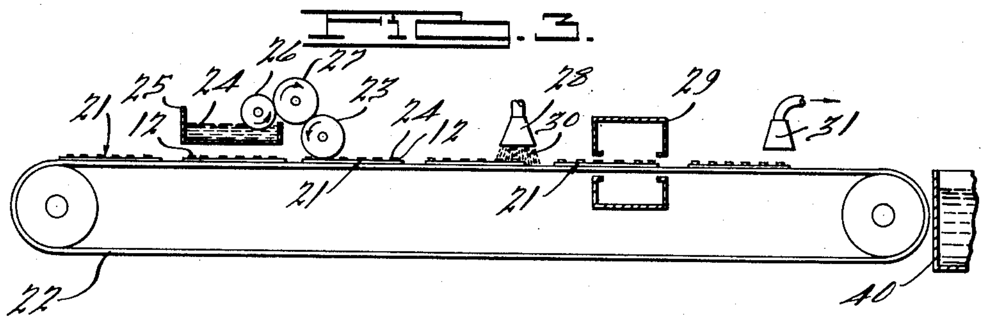
Fig. 3 is a view of a conveyor mechanism by which the wiring board is carried past different elements which operate thereon.
Figure 5:
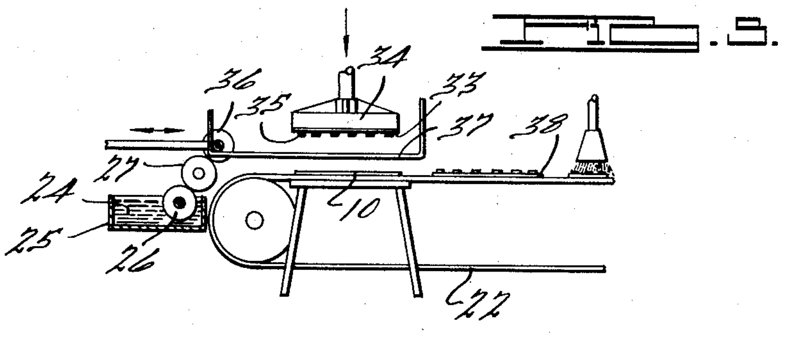
Fig. 5 is a broken view of structure, similar to that illustrated in Fig. 3, showing another form thereof.

Referring to Fig. 5, another method of applying the adhesive accurately to the face of the board 10 is illustrated, that wherein an etched plate 33, such as a printing plate, is mounted on a ram 34 which moves downwardly upon the board 10 carried by a conveyor 22. The raised areas 35 on the face of the plate are the negatives of the wiring pattern to be provided on the board 10. A roller 36 is advanced along a pair of spaced tracks 37 to apply the adhesive 24 from the tank 25 to the raised pattern areas 35 of the plate 33. After the rollers 36 have been advanced along the tracks 37 and returned to the position illustrated for receiving adhesive from the roller 27, the ram 34 is moved downwardly to transfer the adhesive from the pattern areas 35 to the surface of the board 10. Upon the raising of the ram, the board 10 is advanced along the conveyor in the same manner as illustrated in Fig. 3, to have the copper particles 30 applied thereto and air dried or dried by the oven 29 and thereafter pass beneath the vacuum nozzle or otherwise treated to have the loose particles on the face removed therefrom. It is to be understood that the conveyor 22 of Fig. 5 has its movement interrupted during the time the adhesive is applied to the board or the board is raised above the conveyor and supported in a manner to receive the adhesive, after which it is lowered onto the conveyor.

Figure 6:
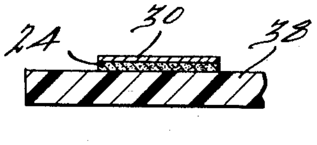
Fig. 6 is a sectional view of structure, similar to that illustrated in Fig. 4, showing a further form of the wiring board.

In Fig. 6 the board 38 is illustrated as having adhesive material 24 and the copper or other conducting particles 30 applied thereto. In this arrangement, the adhesive may be the same as that used in the board 38 so as to have a direct bond thereto. It is within the purview of the invention to heat the plate 33 and have the extended pattern areas soften the resin material of the board in the areas of the wiring pattern and the tacky resin of the board employed to receive the copper particles and securely bond them in conducting relationship to each other over the pattern area. Similarly, the conducting particles may be evenly distributed over a board and pressed therein to form the conducting pattern. When the board contains heat softening resin material, a heated plate 33 is applied directly to the conducting particles. The particles engaged by the pattern on the plate 33 will quickly become heated to heat the resin material aligned with the pattern to a tacky condition into which the heated particles will be embedded and retained in conducting relationship. After the plate is removed, the nonsecured particles are removed from the face of the board, leaving the conducting pattern thereon.

Figure 7:
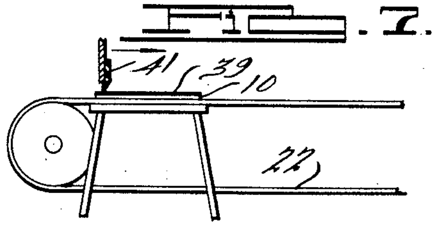
Fig. 7 is a view of structure, similar to that illustrated in Fig. 5, showing another method of constructing the wiring board of the present invention.

In Fig. 7 a further form of the invention is illustrated, that wherein a screen 39 has the pattern areas exposed therethrough through which the adhesive material 24 may be forced by a squeegee 41 in the conventional manner onto the surface of the board 10. The board 10 is then passed along the conveyer 22 in the manner as illustrated in Fig. 3. The resulting board 38 will have the adhesive material and the joined conducting particles 30 maintained in the pattern on the face of the board, as illustrated in Fig. 6.

The board thus produced is similar to the wiring boards now constructed by etching, photographing and other methods, and is more economical of construction. While the copper particles are not bonded to each other, they are retained by an adhesive on the surface of the board in conducting relationship and are further conductively joined when the board is dipped in solder in the conventional manner to join the terminals of the various components which extend from the side opposite to the pattern side through the apertures provided in the board. Thus, further assurance is had that good conductivity is provided throughout the length of the patterns and to the area of the conductors. A further advantage is provided to the board when apertures are punched therein since the flow of adhesive can be regulated so as to have an amount enter the apertures to coat the wall thereof near the face containing the pattern so that the copper particles will cover the face of the apertures and will directly contact the leads extending therethrough so as to eliminate any impedance which often occurs when the leads are conductively joined to the pattern through solder rather than the copper which has a much higher degree of conductivity. It is also within the purview of the invention to dip the wiring board into hot tin or solder to apply a very thin coating upon the conducting pattern areas to eliminate oxidation and to provide a coating to which the solder will adhere. Such a tin or solder pot is illustrated at 40 in Fig. 3 into which the board 21 is dipped after it leaves the conveyor 22.

What is claimed is:

1. A board having wiring patterns thereon over areas which are raised above the face of the board, the face of the raised areas having an adhesive thereon, and copper particles retained in conducting relationship to each other by said adhesive.

2. A board having wiring patterns thereon over areas which are raised above the face of the board, the face of the raised areas having an adhesive thereon, copper particles retained in conducting relationship to each other by said adhesive, said board having apertures extending therethrough in the raised areas thereof, and copper particles adhered to the surface of the apertures in conducting relationship to the particles on the raised areas.

3. A board having wiring patterns thereon over areas which are raised above the face of the board, the face of the raised areas having an adhesive thereon, copper particles retained in conducting relationship to each other by said adhesive, and a thin coating of tinning material on said copper particles.

4. The method of constructing a board with wiring patterns thereon which includes the steps of: embossing areas on the board the shape of said pattern, applying an adhesive to the top surface of the areas, and applying conductive particles to the adhesive in conducting relationship to each other.

5. The method of constructing a wiring pattern on a board having apertures therethrough in the areas of the pattern which includes the steps of: applying an adhesive over the areas of the pattern and on the walls of the apertures, and applying conductive particles to the adhesive of the pattern and that on the wall apertures in conducting relation to each other.

6. The method of forming a wiring pattern on a board which includes the steps of: applying adhesive to the board over the areas of the pattern, applying conductive particles to the adhesive in conducting relationship to each other, and applying a thin coating of tinning material over said conductive particles.

References Cited in the file of this patent

UNITED STATES PATENTS

| | | |
|---|---|---|
| 2,288,860 | Wallace et al. | July 7, 1942 |
| 2,441,960 | Eisler | May 25, 1948 |
| 2,506,604 | Lokker et al. | May 9, 1950 |
| 2,757,443 | Steigerwalt et al. | Aug. 7, 1956 |

FOREIGN PATENTS

| | | |
|---|---|---|
| 637,169 | Great Britain | May 17, 1950 |